(12) United States Patent
Yen (10) Patent No.: US 10,699,641 B2
(45) Date of Patent: Jun. 30, 2020

(54) OLED DISPLAY PANEL AND OLED DISPLAY DEVICE

(71) Applicant: Wuhan China Star Optoelectronics Semiconductor Display Technology Co., Ltd., Wuhan, Hubei (CN)

(72) Inventor: Chihcheng Yen, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 83 days.

(21) Appl. No.: 15/970,280

(22) Filed: May 3, 2018

(65) Prior Publication Data
US 2019/0197958 A1   Jun. 27, 2019

Related U.S. Application Data

(63) Continuation of application No. PCT/CN2018/072864, filed on Jan. 16, 2018.

(30) Foreign Application Priority Data

Dec. 27, 2017   (CN) .......................... 2017 1 1447142

(51) Int. Cl.
*G09G 3/3258* (2016.01)
*H01L 27/32* (2006.01)
(Continued)

(52) U.S. Cl.
CPC ......... *G09G 3/3258* (2013.01); *G09G 3/3233* (2013.01); *H01L 27/3248* (2013.01);
(Continued)

(58) Field of Classification Search
CPC ......... G09G 3/3258; G09G 2310/0262; G09G 2300/0842; G09G 3/3233; H01L 27/3248;
(Continued)

(56) References Cited

U.S. PATENT DOCUMENTS

2011/0157110 A1   6/2011  Chou et al.
2016/0190228 A1*  6/2016  Park ..................... H01L 27/3279
                                                              257/40
2018/0190197 A1*  7/2018  Chang ................... G09G 3/3233

FOREIGN PATENT DOCUMENTS

CN   101859541 A   10/2010
CN   102385834 A    3/2012
(Continued)

*Primary Examiner* — Sahlu Okebato
(74) *Attorney, Agent, or Firm* — Hemisphere Law, PLLC; Zhigang Ma (57) ABSTRACT

An OLED display panel is disclosed, including: a plurality of light emitting diodes arranged from a first end of a display area of a display panel to a second end opposite thereto; an anode voltage output electrode, configured to output an anode reference voltage to a plurality of anodes of the light emitting diodes; and a cathode voltage output electrode, configured to output a cathode reference voltage to a plurality of cathodes of the light emitting diodes; the anode reference voltage is sequentially provided to the light emitting diodes from the first end to the second end, and the cathode reference voltage is sequentially provided to the light emitting diodes from the second end to the first end; or, the anode reference voltage is provided to the light emitting diodes from the first end and the second end respectively. The disclosure further discloses an OLED display device.

20 Claims, 6 Drawing Sheets

(51) Int. Cl.
*H01L 51/52* (2006.01)
*G09G 3/3233* (2016.01)
(52) U.S. Cl.
CPC ...... *H01L 51/5206* (2013.01); *H01L 51/5221* (2013.01); *G09G 2300/0842* (2013.01); *G09G 2310/0262* (2013.01); *H01L 27/3279* (2013.01)
(58) Field of Classification Search
CPC ............. H01L 51/5206; H01L 51/5221; H01L 27/3279
See application file for complete search history.

(56) References Cited

FOREIGN PATENT DOCUMENTS

| | | |
|---|---|---|
| CN | 203386460 U | 1/2014 |
| CN | 104681595 A | 6/2015 |
| CN | 107424571 A | 12/2017 |

* cited by examiner

OLED DISPLAY PANEL AND OLED DISPLAY DEVICE

RELATED APPLICATIONS

The present application is a continuation application of International Application Number PCT/CN2018/072864, filed Jan. 16, 2018, which claims the priority benefit of China Application No. 201711447142.2, filed Dec. 27, 2017, which is herein incorporated by reference in its entirety.

FIELD OF THE DISCLOSURE

The disclosure relates to the field of display technology, and in particular to an OLED display panel and an OLED display device.

BACKGROUND

Organic light emitting diode (OLED) display panels are favored due to their thinness, energy saving, wide viewing angle, wide color gamut and high contrast ratio. The OLED display panel generally includes a plurality of light emitting diodes emitting light to drive the light emitting diodes to externally display images, characters, and the like. In general, the anode of the light emitting diode receives an anode reference voltage, the cathode of the light emitting diode receives a cathode reference voltage, and the anode reference voltage is sequentially transmitted through the wires to the light emitting diode adjacent to the first end and the light emitting diode adjacent to the second light emitting diode opposite to the first end. When the anode reference voltage is transmitted on the wire, a voltage drop occurs due to the existence of wire resistance of the wire so that the anode reference voltage is transmitted from the first end to the second end through the wire, that is, a so-called IR drop problem occurs. As a result, the brightness of the light emitting diode adjacent to the first end is relatively high, and the brightness of the light emitting diode adjacent to the second end is relatively dark, thereby resulting in uneven brightness and uneven overall illumination of the OLED display panel.

SUMMARY

A technical problem to be solved in the embodiments of the disclosure is to provide an OLED display panel and an OLED display device so as to make the overall brightness of the OLED display panel more evenly.

In order to solve the above technical problem, an embodiment of the first aspect of the disclosure provides an OLED display panel, including:

a plurality of light emitting diodes, arranged from a first end of the display area of the display panel to a second end opposite thereto;

an anode voltage output electrode, configured to output an anode reference voltage to a plurality of anode electrodes of the light emitting diodes; and a cathode voltage output electrode, configured to output a cathode reference voltage to a plurality of cathodes of the light emitting diodes.

The anode reference voltage is sequentially provided to the light emitting diodes from the first end to the second end, and the cathode reference voltage is sequentially provided to the light emitting diodes from the second end to the first end; or the anode reference voltage is oppositely provided to the light emitting diodes from the first end and the second end respectively.

The anode voltage output electrode includes a first anode voltage output electrode and a second anode voltage output electrode, the anode reference voltage includes a first sub reference voltage and a second sub reference voltage, the first anode voltage output electrode outputs the first sub reference voltage, the second anode voltage output electrode outputs the second sub reference voltage; the first sub reference voltage is sequentially provided to at least a part of the light emitting diodes from the first end to the second end, and the cathode reference voltage is sequentially provided to at least a part of the light emitting diodes from the second end to the first end.

The first sub reference voltage and the second sub reference voltage are both provided to all of the light emitting diodes.

A plurality of the light emitting diodes form a plurality of columns, and each of the columns of the light emitting diodes extends from the first end to the second end, and the first sub reference voltage and the second sub reference voltage are alternately and sequentially provided to each of the columns of the light emitting diodes.

The first anode voltage output electrode is located at a first end of the OLED display panel, the second anode voltage output electrode is located at a second end of the OLED display panel, the OLED display panel further includes a voltage control chip electrically connected to the first anode voltage output electrode and the second anode voltage output electrode respectively so as to make the first anode voltage output electrode output the first sub reference voltage and the second anode voltage output electrode output the second sub reference voltage.

The first anode voltage output electrode is located at the first end of the OLED display panel, the second anode voltage output electrode is located at the second end of the OLED display panel; the OLED display panel further includes a voltage control chip, the first anode voltage output electrode is electrically connected to the voltage control chip so as to make the first anode voltage output electrode output the first sub reference voltage; the second anode voltage output electrode is electrically connected to the first anode electrode voltage output electrode so as to make the second anode voltage output electrode output the second sub reference voltage.

The cathode voltage output electrode is has a "⊓" shape, the cathode voltage output electrode outputs a cathode reference voltage to the light emitting diodes from other sides except the first end.

The cathode voltage output electrode is located at the second end of the OLED display panel, the anode voltage output electrode is located at the first end of the OLED display panel, the cathode voltage output The cathode output reference voltage of the cathode electrode sequentially outputs the cathode reference voltage to the light emitting diodes from the second end to the first end, and the anode voltage output electrode sequentially outputs the anode reference voltage to the light emitting diodes from the first end to the second end.

The OLED display panel includes a plurality of driving thin film transistors and a plurality of storage capacitors, a source of each of the driving thin film transistors receives the anode reference voltage, a drain of each of the driving thin film transistors is electrically connected to an anode of each of the light emitting diodes, a gate of each of the driving thin film transistors is electrically connected to each of the storage capacitors, and a cathode of each of the light emitting diodes receives the cathode reference voltage, and each of the driving thin film transistors is a P-type thin film transistor.

An embodiment of the second aspect of the disclosure provides an OLED display device, including the above OLED display panel.

The implementation of the embodiment of the disclosure has the following advantageous effects:

since the anode reference voltage is sequentially provided to the light emitting diodes from a first end to a second end, and the cathode reference voltage is sequentially provided to the light emitting diodes from the second end to the first end, or the anode reference voltage is oppositely provided to the light emitting diodes from the first end and the second end respectively. Therefore a brightness of the OLED display panel will be more uniform.

BRIEF DESCRIPTION OF THE DRAWINGS

In order to illustrate technical schemes of the disclosure or the prior art more clearly, the following section briefly introduces drawings used to describe the embodiments and prior art. Obviously, the drawing in the following descriptions is just some embodiments of the disclosure. The ordinary person in the related art can acquire the other drawings according to these drawings without offering creative effort.

DETAILED DESCRIPTION OF PREFERRED EMBODIMENTS

The following sections offer a clear, complete description of this disclosure in combination with the embodiments and accompanying drawings. Obviously, the embodiments described herein are only a part of, but not all of the embodiments of this disclosure. In view of the embodiments described herein, any other embodiment obtained by those of ordinary skill in the art skilled in this art without offering creative effort is included in a scope claimed by this disclosure.

The terms "comprising" and "having," as well as any variations thereof, appearing in the specification, claims and drawings, are intended to cover the inclusion of non-exclusive. For example, a process, method, system, product, or device that incorporates a series of steps or units is not limited to the steps or units listed but may optionally further include steps or units not listed or may optionally further include other steps or units inherent to these processes, methods, products or devices. In addition, the terms "first", "second" and "third" are used to distinguish different objects and are not intended to describe a specific order.

First Embodiment

Figure 1:
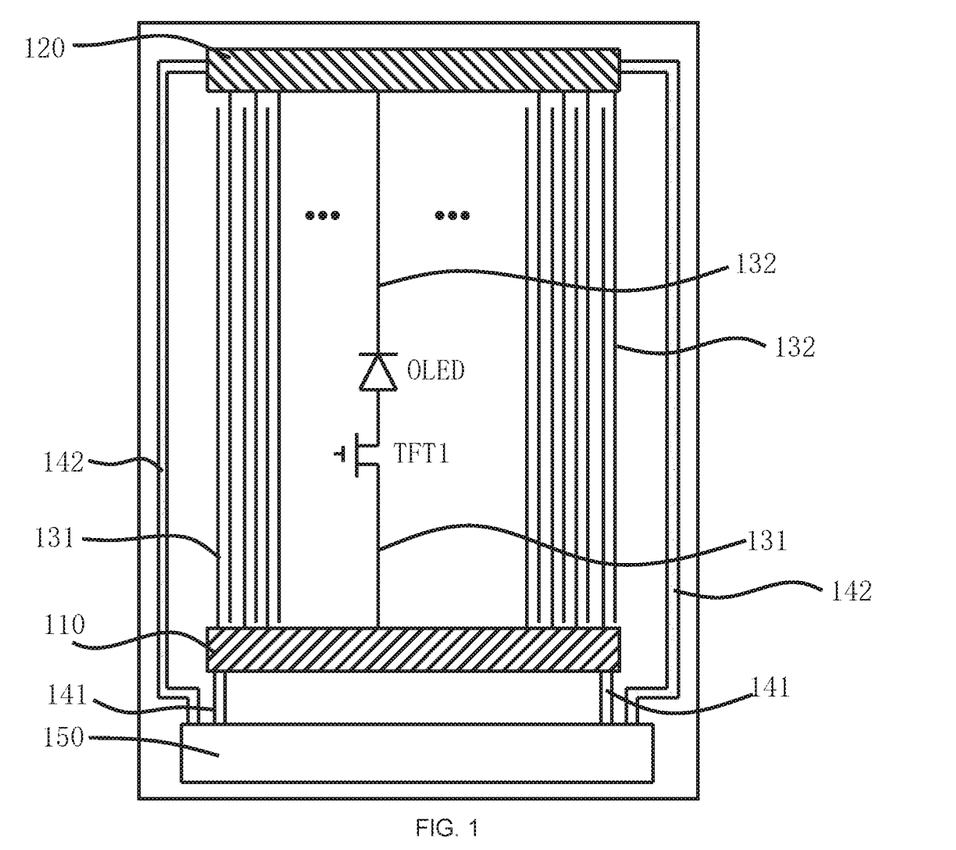
FIG. 1 is a schematic view of an OLED display panel according to a first embodiment of the disclosure.

An embodiment of the disclosure provides an OLED display panel. Referring to FIG. 1, the OLED display panel includes a plurality of light emitting diodes OLED, an anode voltage output electrode 110, and a cathode voltage output electrode 120.

In this embodiment, the light emitting diodes OLED form an array. Specifically, the light emitting diodes OLED form an array of M rows and N columns, that is, each of the rows includes N of light emitting diodes OLED, and each of the columns includes M of light emitting diodes OLED, and M and N are both integers greater than or equal to two. In this embodiment, the light emitting diodes OLED are arranged from a first end of a display area of the display panel to a second end opposite thereto. Specifically, referring to FIG. 1, the first end is a lower end of the display area, and the second end is an upper end of the display area. From bottom to top, the M rows of light emitting diodes OLED are a first row of the light emitting diodes OLED, a second row of light emitting diodes OLED, . . . , and an Mth row of the light emitting diodes OLED, and each of the N columns of light emitting diodes OLED extends from the first end to the second end.

In this embodiment, the anode voltage output electrode 110 is located at the first end of the OLED display panel, the anode voltage output electrode 110 is configured to provide an anode reference voltage VDD, and the anode reference voltage VDD is output to all of the anodes of the light emitting diodes OLED (schematically illustrated as a connection of one of the light emitting diodes OLED in FIG. 1), so that the anodes of all of the light emitting diodes OLED can obtain the anode reference voltage VDD.

In this embodiment, the cathode voltage output electrode 120 is located at the second end of the OLED display panel, the cathode voltage output electrode 120 is configured to provide a cathode reference voltage VSS, and the cathode reference voltage VSS is output to the cathodes of all of the light emitting diodes OLED. When the anodes of the light emitting diodes OLED receive the anode reference voltage VDD and the cathodes thereof receive the cathode reference voltage VSS, the light emitting diodes OLED emit light.

In this embodiment, the anode reference voltage VDD is sequentially output to the light emitting diodes OLED from the first end to the second end, that is, the anode reference voltage VDD is first output to the anodes of the first row of light emitting diodes OLED and then output to the anodes of the second row of light emitting diodes OLED, . . . , and finally the anodes of the Mth row of light emitting diodes OLED. In this embodiment, the anode reference voltage VDD is transmitted through a plurality of anode transmission lines 131, the first ends of the anode transmission lines 131 are electrically connected to the anode voltage output electrode, and the anode transmission lines 131 extend from the first end to the second end, and the anode transmission lines 131 are relatively thin so that the line resistance is relatively high; when the anode reference voltage VDD is transmitted from the first end to the second end, a voltage drop occurs in the anode reference voltage VDD. For example, a voltage difference between the anode reference voltage VDD transmitted to the first row of the light emitting diodes OLED and the anode reference voltage VDD transmitted to the Mth row of the light emitting diodes OLED is 0.2V, 0.3V, 0.4V and so on, thereby occurring the problem of IR drop and then reducing the current flowing through the light emitting diodes OLED and then causing the brightness of the light emitting diodes OLED adjacent to the first end and the light emitting diodes OLED adjacent to the second end emit light different, resulting in uneven display of the OLED display panel.

In order to solve the above problem, the inventors of the disclosure found that in addition to the effect of the anode reference voltage VDD received, here, the reduction of the current Ioled caused by the anode reference voltage VDD is referred to as ΔIoled+ (e.g. which may be referred to as a first current reduction value), the current Ioled (driving current) flowing through the light emitting diode OLED is also affected by the cathode reference voltage VSS received by the light emitting diode OLED; specifically, the decrease of the current Ioled flowing through the light emitting diode OLED is proportional to the voltage drop of the cathode reference voltage VSS due to the transmission; here, the reduction of the cathode reference voltage VSS caused by the current Ioled flowing through the light emitting diode OLED is referred to as ΔIoled− (e.g. which may be referred to as a second current reduction value).

Specifically, since a driving thin film transistor TFT1 is provided between the anode of the light emitting diode OLED and the input terminal of the anode reference voltage VDD, the driving thin film transistor TFT1 is a P-type thin film transistor; the source of the driving thin film transistor TFT1 receives an anode reference voltage VDD. The cathode of the driving thin film transistor TFT1 receives the cathode reference voltage VSS through the light emitting diode OLED. Since the driving thin film transistor TFT1 is affected by the short channel effect, when the source voltage of the driving thin film transistor TFT1 is unchanged, the cathode reference voltage VSS decreases, and thus the voltage difference Vds between the drain and the gate of the driving thin film transistor TFT1 decreases, resulting in the saturation current flowing through the driving thin film transistor TFT1 decreases. Therefore, with the short channel effect, in this embodiment, the cathode reference voltage VSS is sequentially supplied to the cathodes of the light emitting diodes OLED from the second end to the first end, that is, supplied to the cathodes of the light emitting diodes OLED from the top to the bottom in FIG. 1, that is, the cathode reference voltage VSS is first supplied to the Mth row of light emitting diodes OLED and then to the (M−1)th row of light emitting diodes OLED, . . . , and finally to the first row of light emitting diodes OLED. In this embodiment, the cathode reference voltage VSS is transmitted through the cathode transmission lines 132. The second ends of the cathode transmission lines 132 are electrically connected to the cathode voltage output electrode 120. The cathode transmission lines 132 extend from the second end to the first end, the cathode transmission lines 132 are thinner so that the line resistance is relatively high; when the cathode reference voltage VSS is transmitted from the second end to the first end, a voltage drop occurs in the cathode reference voltage VSS, for example, the voltage difference between the cathode reference voltage VSS transmitted to the cathodes of the Mth row light emitting diodes OLED and the cathode reference voltage VSS transmitted to the cathodes of the first row light emitting diodes OLED are 0.2V, 0.3V, 0.4V and the like, so that the closer to the second end, the voltage drop Vds between the drain and the source of the driving thin film transistor TFT1 is larger (a smaller voltage drop occurs in the cathode reference voltage VSS and a large voltage drop occurs in the anode reference voltage VDD); the closer to the first end, the smaller the voltage difference Vds between the drain and the source of the driving thin film transistor TFT1 (a large voltage drop occurs in the cathode reference voltage VSS and a smaller voltage drop in the anode reference voltage VDD occurs, that is, which can be seen as the Vds of the first end relative to the Vds of the second end has been reduced); thus, due to the short channel effect, ΔIoled− appearing at the second end is smaller and ΔIoled− appearing at the first end is larger.

In this embodiment, the anode reference voltage VDD has an influence on the current flowing through the light emitting diode OLED due to the voltage drop, the closer to the first end, the ΔIoled+ is smaller, and the closer to the second end, the larger ΔIoled+ is. The current flowing through the light emitting diode OLED is affected by the voltage drop of the anode reference voltage VDD and the voltage drop of the cathode reference voltage VSS. Therefore, at the first end, ΔIoled+ is relatively small and ΔIoled− is relatively large, while in the second end, ΔIoled+ is relatively large and ΔIoled− is relatively small, so that the current finally flowing through the light emitting diode OLED at both ends will be reduced to some extent and the magnitudes of the currents at the two ends and flowing through the light emitting diodes OLED between the two ends decrease in a consistent manner, that is, the current flowing through the light emitting diode OLED will be more consistent, so that the display of the entire OLED display panel will be more uniform, which improves the problem of the uneven display of the OLED display panel in the prior art.

In order to make the anode voltage output electrode 110 to obtain the anode reference voltage VDD and make the cathode voltage output electrode 120 to obtain the cathode reference voltage VSS, in this embodiment, the OLED display panel further includes a voltage control chip 150, and the voltage control chip 150 is electrically connected to the anode voltage output electrode 110 and the cathode voltage output electrode 120 respectively. The voltage control chip outputs a corresponding voltage respectively to the anode voltage output electrode 110 and the cathode voltage output electrode 120. Specifically, in this embodiment, the voltage control chip 150 is located at the first end of the OLED display panel, and specifically, the voltage control chip 150 is located at the lower end of the anode voltage output electrode 110. The anode voltage output electrode 110 is electrically connected to the voltage control chip 150 through the anode transmission lines 141. Since the cathode voltage output electrode 120 and the voltage control chip 150 are located at two opposite ends of the OLED display panel, in order to achieve the electrical connection therebetween, in this embodiment, both sides of the region where the light emitting diodes OLED are located are respectively disposed with the cathode transmission lines 142 (non-display area), both ends of the cathode transmission lines 142 are electrically connected to the cathode voltage output electrode 120 and the voltage control chip 150 respectively so as to achieve the voltage output by the voltage control chip 150 to the cathode voltage output electrode 120, when the output voltage reaches the cathode voltage output electrode 120, the output voltages is referred as a cathode reference voltage VSS (considering the voltage drop caused by the transmission). In this embodiment, the anode transmission lines 141 and the cathode transmission lines 142 are located outside the display area of the OLED display panel so that the anode transmission lines 141 are relatively thick and the overall impedance is relatively small. In addition, in another embodiment of the disclosure, when the voltage control chip 150 is located at the second end of the OLED display panel, the anode transmission lines 141 are located on both side edges of the region where the light emitting diodes OLED are located.

In addition, in this embodiment, the OLED display panel further includes a flexible circuit board located at the second end of the OLED display panel, and the voltage control chip 150 is located on the flexible circuit board (chip-on-film, COF). However, the disclosure is not limited thereto, in other embodiments of the disclosure, the OLED display panel may not further include a flexible circuit board.

In addition, an embodiment of the disclosure further provides an OLED display device, including the OLED display panel described above.

Second Embodiment

Figure 2:
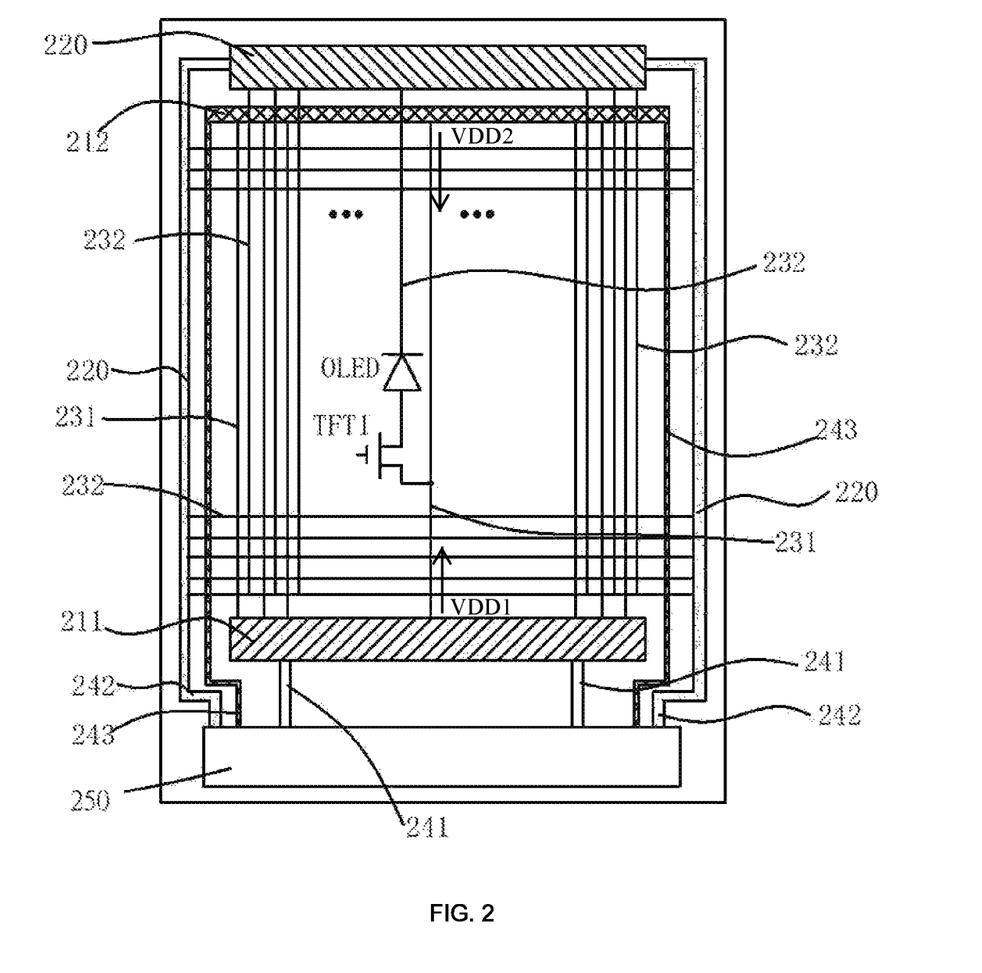
FIG. 2 is a schematic view of an OLED display panel according to a second embodiment of the disclosure.

An embodiment of the disclosure provides an OLED display panel. Referring to FIG. 2, the OLED display panel includes a plurality of light emitting diodes OLED, an anode voltage output electrode, and a cathode voltage output electrode 220.

In this embodiment, the light emitting diodes OLED form an array. Specifically, the light emitting diodes OLED form an array of M rows and N columns, that is, each of the rows includes N of light emitting diodes OLED, and each of the columns includes M of light emitting diodes OLED, and M and N are both integers greater than or equal to two. In this embodiment, the light emitting diodes OLED are arranged from the first end of the display area (the area where the user can view) of the display panel to the second end opposite to the first end. Specifically, referring to FIG. 1, the first end is a lower end of the display area, and the second end is an upper end of the display area. From bottom to top, the M rows of light emitting diodes OLED are a first row of light emitting diodes OLED, a second row of light emitting diodes OLED, . . . , and an Mth row of light emitting diodes OLED, Extend to the second end.

In this embodiment, the anode voltage output electrode is used to provide an anode reference voltage VDD which is output to the anodes of all the light emitting diodes OLED (the connection of one light emitting diode OLED is schematically drawn in FIG. 2), so that the anode of all the light emitting diodes OLED can obtain the anode reference voltage VDD.

In this embodiment, the cathode voltage output electrode 220 is used to provide a cathode reference voltage VSS, which is output to the cathodes of all the light emitting diodes OLED. When the anodes of the light emitting diodes OLED receive the anode reference voltage VDD and the cathodes thereof receive the cathode reference voltage VSS, the light emitting diodes OLED emit light.

In order to improve the problem of uneven display of the OLED display panel due to the IR drop, in this embodiment, the anode reference voltage VDD is provided to the anodes of all the light emitting diodes OLED from the first end and the second end, respectively. Specifically, in this embodiment, the anode voltage output electrode includes a first anode voltage output electrode 211 and a second anode voltage output electrode 212, and the first anode voltage output electrode 211 is located at a first end of the OLED display panel, and the second anode voltage output electrode 212 is located at the second end of the OLED display panel.

In this embodiment, the anode reference voltage VDD includes a first sub reference voltage VDD1 and a second sub reference voltage VDD2, the first anode voltage output electrode 211 outputs a first sub reference voltage VDD1, and the second anode voltage output electrode 212 outputs the second sub reference voltage VDD2. In this embodiment, the first sub reference voltage VDD1 is sequentially output to the anodes of all of the light emitting diodes OLED from the first end to the second end, that is, the first sub reference voltage VDD1 is first output to the anodes of the first row of light emitting diodes OLED and then output to the anodes of the second row of light emitting diodes OLED, . . . , and finally the anodes of the Mth row of light emitting diodes OLED; the second sub reference voltage VDD2 is sequentially output to the anodes of all of the light emitting diodes OLED from the second end to the first end, that is, the second sub reference voltage VDD2 is first output to the anodes of the Mth row of light emitting diodes OLED and then output to the anodes of the (M−1)th row of light emitting diodes OLED, . . . , and finally the anodes of the first row of light emitting diodes OLED. Thus, the first sub reference voltage VDD1 and the second sub reference voltage VDD2 are supplied to the anodes of all the light emitting diodes OLED from the first end and the second end oppositely.

In this embodiment, the first sub reference voltage VDD1 is transmitted to the anodes of all the light emitting diodes OLED from the first end to the second end through a plurality of anode transmission lines 231, and the second sub reference voltage VDD2 is transmitted to the anode of all the light emitting diodes OLED from the second end to the first end through the anode transmission lines 231, that is, both ends of the anode transmission lines 231 are electrically connected to the first anode voltage output electrode 211 and the second anode voltage output electrode 212, respectively. Therefore, at the anode of the light emitting diode OLED adjacent to the first end, the first sub reference voltage VDD1 compensates for the voltage drop of the second sub reference voltage VDD2, and at the anode of the light emitting diode OLED adjacent to the second end, the second sub reference voltage VDD2 compensates for the voltage drop of the first sub reference voltage VDD1 so that the voltage received by the anode of the light emitting diode OLED as a whole will be relatively consistent, the driving current of driving the light emitting diode OLED will also be relatively consistent, and therefore the light emitting diodes OLED of the whole display panel emit more consistent light, so that the OLED display panel displays more evenly. In this embodiment, the first sub reference voltage VDD1 and the second sub reference voltage VDD2 may be the same or different, preferably the same. In this embodiment, one of the anode transmission lines 231 is disposed corresponding to a row of light emitting diodes OLED. That is, the anodes of light emitting diodes of the same column are electrically connected to the same one of the anode transmission lines 231.

In order to make the first anode voltage output electrode 211 provide the first sub reference voltage VDD1, make the second anode voltage output electrode 212 provide the second sub reference voltage VDD2, and make the cathode voltage output electrode 220 provide the cathode reference voltage VSS, in this embodiment, the OLED display panel further includes a voltage control chip 250. The voltage control chip 250 is electrically connected to the first anode voltage output electrode 211, the second anode voltage output electrode 212, and the cathode voltage output electrode 220 respectively. The voltage control chip 250 outputs a corresponding voltage to the first anode voltage output electrode 211, the second anode voltage output electrode 212, and the cathode voltage output electrode 120, respectively, so that the first anode voltage output electrode 211 provides the first sub reference voltage VDD1, the second anode voltage output electrode 212 provides the second sub reference voltage VDD2, and the cathode voltage output electrode 220 provides the cathode reference voltage VSS.

Specifically, in the present embodiment, the voltage control chip 250 and the first anode voltage output electrode 211 are located at a first end (non-display area) of the OLED display panel, that is, both of the voltage control chip 250 and the first anode voltage output electrode 211 are located on the lower end of the OLED display panel (relative to the display area of the OLED display panel), the voltage control chip 250 is located at a lower end of the first anode voltage output electrode 211, and the second anode voltage output electrode 212 is located at a second end (non-display area) of the OLED display panel. The first anode voltage anode output electrode 211 is electrically connected to the voltage control chip 250 through the first transmission lines 241, and the second anode voltage anode output electrode 212 is electrically connected to the voltage chip 250 through the second transmission lines 243, and the cathode voltage output electrode 120 is electrically connected to the voltage control chip 250 through the cathode transmission lines 242. Since the anode voltage output electrode 212 and the voltage control chip 250 are located at two opposite ends of the OLED display panel, in order to achieve the electrical connection therebetween, in this embodiment, the second anode transmission lines 243 are disposed at both edges of the region where the light emitting diodes OLED are located, and both ends of the second anode transmission lines 243 are electrically connected to the anode voltage output electrode 212 and the voltage control chip 250 respectively, so as to achieve the voltage output from the voltage control chip 250 to the second anode transmission lines 243 when the output voltage reaches the second anode transmission lines 243, the output voltages is referred as a second sub reference voltage VDD2 (considering the voltage drop caused by the transmission). In this embodiment, the first anode transmission wires 241, the second anode transmission wires 243, and the cathode transmission wires 242 are located outside the display area of the OLED display panel (non-display area), so as to be relatively thick and the overall impedance is relatively small. In addition, in other embodiments of the disclosure, when the voltage control chip is located at the second end of the OLED display panel, the first anode transmission lines are located on both side edges of the region where the light emitting diodes OLED are located.

In this embodiment, in order to reduce the influence of the cathode reference voltage VSS on the driving current flowing through the light emitting diode OLED, in this embodiment, the cathode reference voltage VSS is transmitted to the cathodes of the light emitting diodes OLED from the other side except the first end. Specifically, in this embodiment, the cathode reference voltage VSS is transmitted from the left side, the right side, and the upper side of the OLED display panel to the cathodes of the light emitting diodes OLED through the cathode transmission lines 232, so that the cathode reference voltage VSS received from the cathodes of all the light emitting diodes OLED is more consistent. In this embodiment, the cathode voltage output electrodes 220 have a "⊓" shape and are respectively located at the upper end, the left end, and the right end of the OLED display panel, that is, the other ends except the first end, and the cathode transmission lines 232 are plural, portions of the cathode transmission lines 232 extend from the first end to the second end and the remaining portion of the cathode transmission lines 232 extend from the left end to the right end, the cathode transmission lines 232 extending from the first end to the second end is electrically connected to the cathode voltage output electrode 220, and both ends of the cathode transmission lines 232 extending from the left end to the right end are electrically connected to the cathode voltage output electrode 220 on the left end and the cathode voltage output electrode 220 on the right end respectively. In addition, the cathode transmission lines 232 extending from the first end to the second end and the cathode transmission lines 232 extending from the left end to the right end are electrically connected to each other at intersections in order to make the cathode reference voltages VSS throughout the display panel more consistent.

In this embodiment, in order to control the light emitting diode OLED to emit light, the OLED display panel includes an OLED driving circuit. Specifically, referring to FIG. 3, the OLED driving circuit includes a switching thin film transistor M2, a driving thin film transistor M1, a third thin film transistor M3, a fourth thin film transistor M4, a fifth thin film transistor M5, a sixth thin film transistor M6, a seventh thin film transistor M7, and a storage capacitor C1.

Figure 3:
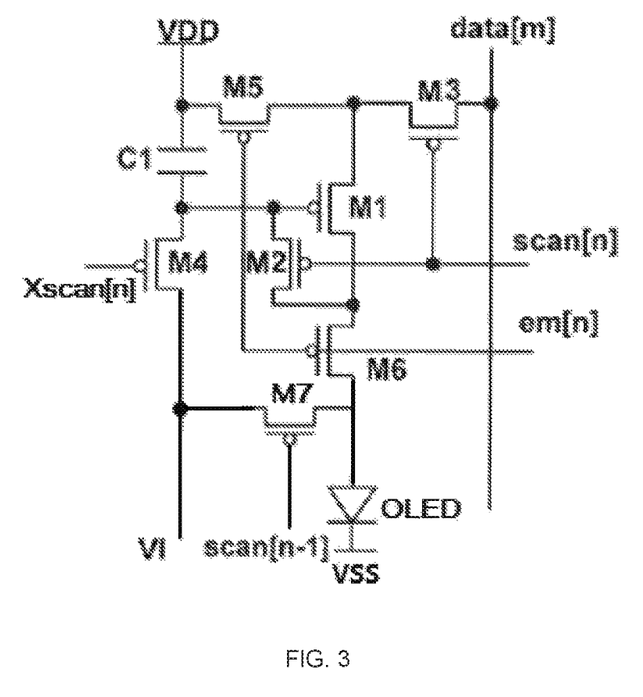
FIG. 3 is a driving circuit diagram of a light emitting diode according to the second embodiment of the disclosure.

In this embodiment, the upper electrode of the storage capacitor C1 receives the anode reference voltage VDD, and the lower electrode of the storage capacitor C1 is electrically connected to the gate of the driving thin film transistor M1. The first terminal of the switching thin film transistor M2 is electrically connected to the gate of the driving thin film transistor M1, the second terminal of the switching thin film transistor M2 is electrically connected to the second terminal of the driving thin film transistor M1, the gate of the switching thin film transistor M2 receives the nth-stage scanning signal scan[n], where n is an integer greater than or equal to 2; a first terminal of the driving thin film transistor M1 is electrically connected to a first terminal of the third thin film transistor M3 and a second terminal of the fifth thin film transistor M5, and a second terminal of the driving thin film transistor M1 is electrically connected to the first terminal of the sixth thin film transistor M6; the first terminal of the fifth thin film transistor M5 is electrically connected to the upper electrode of the storage capacitor C1, and the gate of the fifth thin film transistor M5 receives the nth-stage enable signal em[n]; a second terminal of the third thin film transistor M3 receives a mth data signal data[m], where m is an integer greater than or equal to 1, and a gate of the third thin film transistor M3 receives the nth-stage scanning signal; the second terminal of the sixth thin film transistor M6 is electrically connected to the anode of the light emitting diode OLED, the gate of the sixth thin film transistor M6 receives the nth-stage enable signal em[n], and the cathode of the light emitting diode OLED receives the cathode reference voltage VSS; the first terminal of the fourth thin film transistor M4 is electrically connected to the gate of the driving thin film transistor M1, the second terminal of the fourth thin film transistor M4 receives the reset voltage VI, the gate of the fourth thin film transistor M4 receives the inverted signal Xscan[n] of the nth-stage scanning signal; the seventh terminal of the seventh thin film transistor M7 receives the reset voltage VI, the second terminal of the seventh thin film transistor M7 is electrically connected to the anode of the light emitting diode OLED, and the gate of the seventh thin film transistor M7 receives the (n−1)th-stage scanning signal scan[n−1]. In this embodiment, the first terminal is the source, the second terminal is the drain, or vice versa. In this embodiment, the switching thin film transistor M2, the driving thin film transistor M1, the third thin film transistor M3, the fourth thin film transistor M4, the fifth thin film transistor M5, the sixth thin film transistor M6, and the seventh thin film transistor M7 are all P-type thin film transistor. However, in other embodiments of the disclosure, the switching thin film transistor M2, the driving thin film transistor M1, the third thin film transistor M3, the fourth thin film transistor M4, the fifth thin film transistor M5, the sixth thin film transistor M6, and the seventh thin film transistor M7 are all N-type thin film transistors.

In this embodiment, the driving current Ioled flowing through the light emitting diodes OLED is calculated as follows:

$$Ioled=k(Vgs-Vth)^2;$$

where Ioled is the current flowing through the light-emitting diodes OLED, which is also referred to as the driving current of the light emitting diode OLED; k is the current amplification coefficient of the driving thin film transistor M1, which is determined by the characteristics of the driving thin film transistor M1; Vgs is the voltage between the gate and the source of the driving thin film transistor M1; and Vth is the threshold voltage of the driving thin film transistor M1.

In this embodiment, since the anode reference voltage VDD received by the anode of the entire light emitting diode OLED is relatively consistent, the voltage between the gate and the source of the driving thin film transistor M1 is also relatively consistent, so that the Vgs in the calculation formula of the driving current Ioled is more consistent, the driving current Ioled of the light emitting diode OLED throughout the OLED display panel is relatively consistent, and therefore the entire OLED display panel emits more consistent light.

In addition, an embodiment of the disclosure further provides an OLED display device, including the OLED display panel described above.

Third Embodiment

Figure 4:
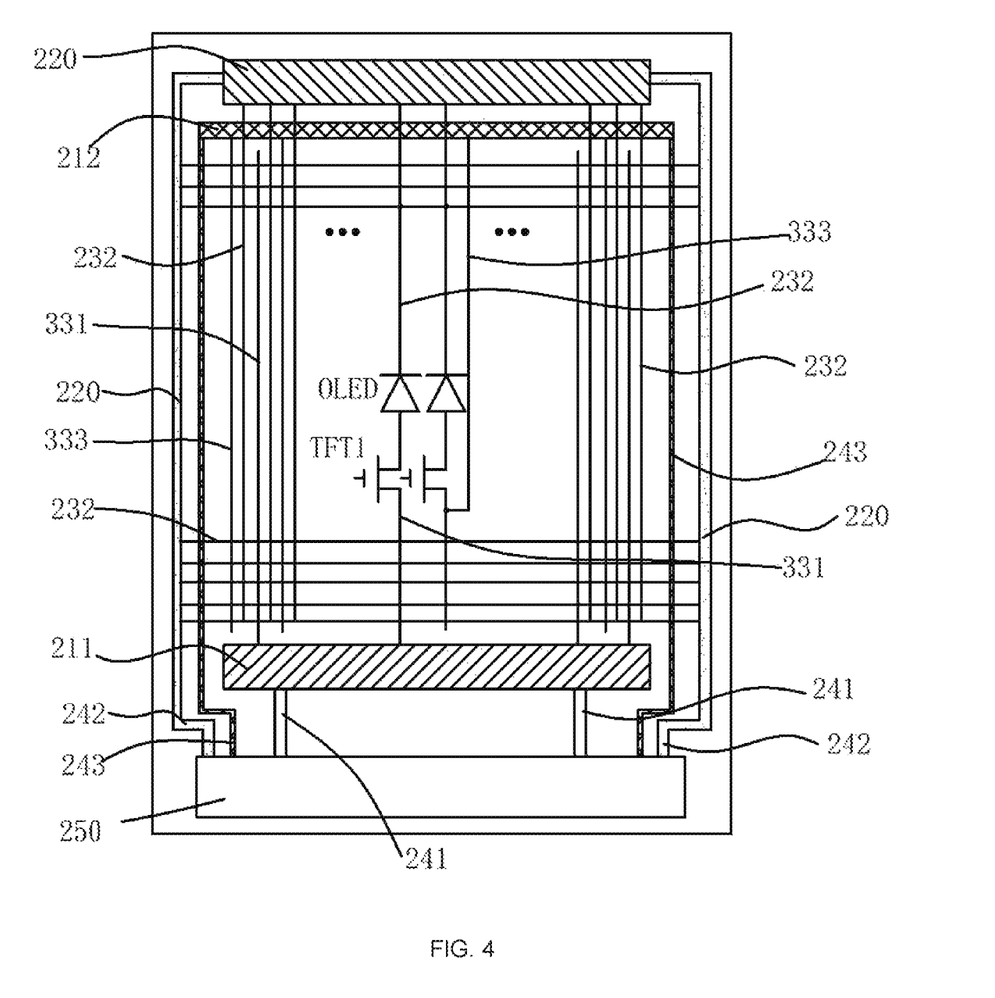
FIG. 4 is a schematic diagram of an OLED display panel according to a third embodiment of the disclosure.

FIG. 4 is a schematic view of an OLED display panel according to a third embodiment of the disclosure. The schematic diagram of FIG. 4 is similar to the schematic diagram of FIG. 2, and therefore, the same reference numerals denote the same components. The main difference between this embodiment and the second embodiment is the transmission of the anode reference voltage.

Referring to FIG. 4, in this embodiment, a plurality of the light emitting diodes OLED are formed in N columns, and each column of the light emitting diodes OLED extends from a first end to a second end. The first sub reference voltage VDD1 and the second sub reference voltage VDD2 is alternately output to the anodes of the light emitting diodes OLED.

Specifically, in this embodiment, the anode reference voltage VDD is transmitted to the anode of the light emitting diode OLED through the anode transmission lines, the number of the anode transmission lines is N, extending in the longitudinal direction, that is, extending from the first end to the second end or vice versa. Specifically, each of the anode transmission lines includes a first anode transmission line 331 and a second anode transmission line 333.

Figure 5:
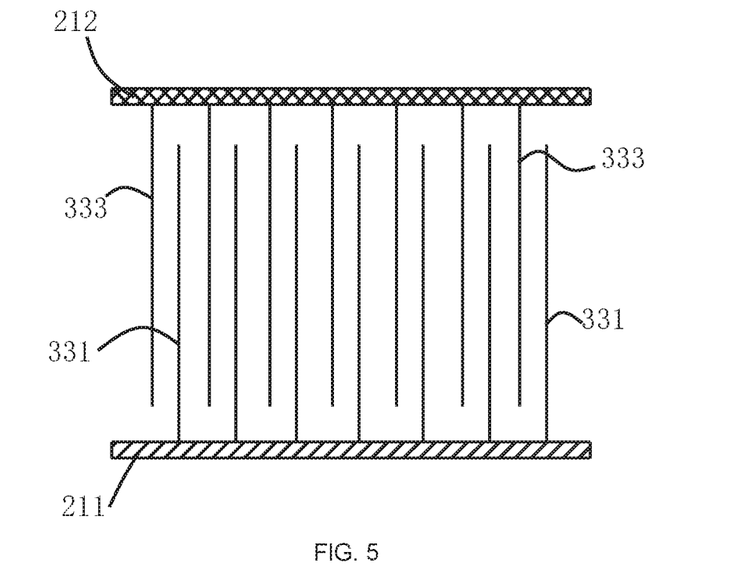
FIG. 5 is a schematic diagram of a connection of the anode voltage output electrodes and the anode transmission lines in the third embodiment of the disclosure.

Specifically, referring to FIG. 4 and FIG. 5, the anode transmission lines 231 are divided into odd-numbered anode transmission lines and even-numbered anode transmission lines according to a sequence from left to right in FIG. 4 and FIG. 5. The odd-numbered anode transmission lines numbered from left to right are 1, 3, 5, 7, 9, . . . , in this embodiment these anode transmission lines are referred as the second anode transmission lines 333, and even-numbered anode transmission lines numbered from left to right are 2, 4, 6, 8, 10, . . . , and in this embodiment, the anode transmission lines are referred to as the first anode transmission lines 331. The first anode transmission lines 331 are electrically connected to the first anode voltage output electrode 211 so as to receive a first sub reference voltage VDD1 from the first anode voltage output electrode 211, the second anode transmission lines 333 is electrically connected to the second anode voltage output electrode 212 so as to receive the second sub reference voltage VDD2 from the second anode voltage output electrode 212. Thus, the first sub reference voltage VDD1 is transmitted from the first end to the second end via the first anode transmission lines 331 to the anode of the light emitting diodes OLED connected thereto, and the second sub reference voltage VDD2 is transmitted to the anodes of the light emitting diodes OLED from the second end to the first end through the second anode transmission lines 333 (the two adjacent light emitting diodes in the same row are illustrated in FIG. 4).

Due to the voltage drop during the transmission, the anode of the light emitting diode OLED electrically connected to the first anode transmission line 331 has a higher voltage near the first end and a lower voltage adjacent to the second end (a voltage drop is caused), that is, the light emitting diode OLED electrically connected to the anode transmission lines 331 will be brighter near the first end and will be darker near the second end. Meanwhile, the anode of the light emitting diode OLED electrically connected to the second anode transmission line 333 has a higher voltage near the second end and a lower voltage adjacent to the first end (a voltage drop is caused), that is, the light emitting diode OLED electrically connected to the second anode transmission line 333 will be brighter near the second end and will be darker near the first end. Since the first anode transmission lines 331 and the second anode transmission line s333 are alternately arranged, the light emitting diodes OLED electrically connected to the first anode transmission lines 331 and the light emitting diodes OLED electrically connected to the second anode transmission lines 333 are also alternately arranged and therefore, adjacent to the first end, the brightness of the light emitting diodes OLED electrically connected to the first anode transmission lines 331 compensate the brightness of the light emitting diodes OLED electrically connected to the second anode transmission lines 333, and adjacent to the second end, the brightness of the light emitting diodes OLED electrically connected to the second anode transmission lines 333 will compensate the brightness of the light emitting diode OLED electrically connected to the first anode transmission lines 331, thus the overall brightness of the OLED display panel will be more uniform. In addition, in other embodiments of the disclosure, the first anode transmission lines are the anode transmission lines numbered (1, 2, . . . , k), (2k+1, 2k+2, . . . , 3k), . . . ; the second anode transmission lines are the anode transmission lines numbered (k+1, k+2, . . . , 2k), (3k+1, 3k+2, . . . , 4k), . . . , where k is an integer greater than or equal to 2, and k is less than or equal to 10, for example, the first anode transmission lines 331 include the anode transmission lines numbered (1, 2, 3), (7, 8, 9), (13, 14, 15), . . . arranged from left to right, the second anode transmission lines 333 include the anode transmission lines numbered (4, 5, 6), (10, 11, 12), (16, 17, 18), . . . from left to right.

Fourth Embodiment

Figure 6:
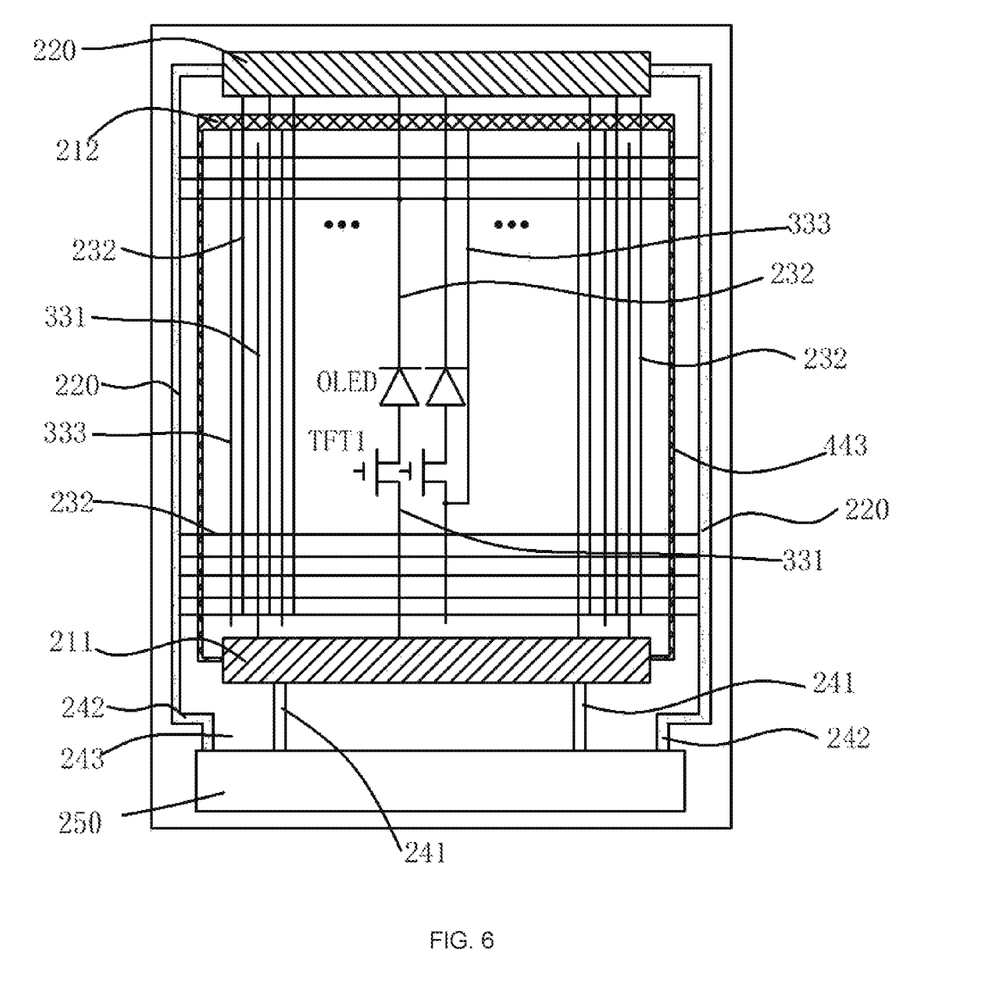
FIG. 6 is a schematic diagram of an OLED display panel according to a fourth embodiment of the disclosure.

FIG. 6 is a schematic view of an OLED display panel according to a fourth embodiment of the disclosure. The main difference between this embodiment and the third embodiment is the transmission of the anode reference voltage.

Referring to FIG. 6, in this embodiment, the first anode voltage output electrode 211 is located at the first end of the OLED display panel, the second anode voltage output electrode 212 is located at the second end of the OLED display panel, and the anode voltage output electrode 211 outputs a first sub reference voltage VDD1, and the second anode voltage output electrode 212 outputs a second sub reference voltage VDD2. In this embodiment, the second anode voltage output electrode 212 is electrically connected to the first anode voltage output electrode 211. Specifically, a second anode transmission line 443 is disposed on each of the left and right edges of the region where the light emitting diodes OLED are located, the both ends of the second anode transmission line 443 are respectively electrically connected to the first anode voltage output electrode 211 and the second anode voltage output electrode 212. Since the second anode transmission lines 443 are located outside the area (non-display area) where the light emitting diodes OLED are located so that the second anode transmission lines 443 may be relatively thick and the overall impedance is relatively small, and thus the first sub reference voltage VDD1 is transmitted to the second anode voltage output electrode 212 through the second anode transmission lines 443 on the left and right to form the second sub reference voltage VDD2; since the voltage drop of the first sub reference voltage VDD1 is smaller when the second sub reference voltage VDD1 is transmitted on the second anode transmission lines 443, the second sub reference voltage VDD2 is closer to the first sub reference voltage VDD1 or may be the same.

It should be noted that, each embodiment in the specification is described by adopting a progressive manner. Each embodiment focuses on its differences from other embodiments, and for a same or similar part, mutual reference may be made between each embodiment. For the apparatus embodiment, because it is basically similar to the method embodiment, it is described rather briefly, and for the relevant parts, reference may be made to some descriptions of the system embodiment.

The above disclosure is only the preferred embodiments of the disclosure, and certainly cannot be used to limit the scope of the disclosure. Therefore, equivalent changes made according to the claims of the disclosure are still within the scope of the disclosure.

What is claimed is:

1. An OLED display panel, comprising:
    a plurality of light emitting diodes, arranged from a first end of a display area of the display panel to a second end opposite thereto;
    an anode voltage output electrode, configured to output an anode reference voltage to a plurality of anodes of the light emitting diodes; and
    a cathode voltage output electrode, configured to output a cathode reference voltage to a plurality of cathodes of the light emitting diodes;
    wherein the anode reference voltage is sequentially provided to the light emitting diodes from the first end to the second end, and the cathode reference voltage is sequentially provided to the light emitting diodes from the second end to the first end; or the anode reference voltage is provided to the light emitting diodes from the first end and the second end respectively,
    wherein the cathode reference voltage is provided to the light emitting diodes through a plurality of cathode transmission lines, and at least two of the cathode transmission lines are extended in different directions such that the at least two of the cathode transmission lines crosses over each other.

2. The OLED display panel according to claim 1, wherein the anode voltage output electrode comprises a first anode voltage output electrode and a second anode voltage output electrode, the anode reference voltage comprises a first sub reference voltage and a second sub reference voltage, the first anode voltage output electrode outputs the first sub reference voltage, the second anode voltage output electrode outputs the second sub reference voltage, the first sub reference voltage is sequentially provided to at least a part of the light emitting diodes from the first end to the second end, and the cathode reference voltage is sequentially provided to at least a part of the light emitting diodes from the second end to the first end.

3. The OLED display panel according to claim 2, wherein the first sub reference voltage and the second sub reference voltage are both provided to all of the light emitting diodes.

4. The OLED display panel according to claim 2, wherein a plurality of the light emitting diodes forms a plurality of columns, and each of the columns of the light emitting diodes extends from the first end to the second end, and the first sub reference voltage and the second sub reference voltage are alternately and sequentially provided to each of the columns of the light emitting diodes.

5. The OLED display panel according to claim 2, wherein the first anode voltage output electrode is located at a first end of the OLED display panel, the second anode voltage output electrode is located at a second end of the OLED display panel, the OLED display panel further comprises a voltage control chip electrically connected to the first anode voltage output electrode and the second anode voltage output electrode respectively so as to make the first anode voltage output electrode output the first sub reference voltage and the second anode voltage output electrode output the second sub reference voltage.

6. The OLED display panel according to claim 3, wherein the first anode voltage output electrode is located at a first end of the OLED display panel, the second anode voltage output electrode is located at a second end of the OLED display panel, the OLED display panel further comprises a voltage control chip electrically connected to the first anode voltage output electrode and the second anode voltage output electrode respectively so as to make the first anode voltage output electrode output the first sub reference voltage and the second anode voltage output electrode output the second sub reference voltage.

7. The OLED display panel according to claim 4, wherein the first anode voltage output electrode is located at a first end of the OLED display panel, the second anode voltage output electrode is located at a second end of the OLED display panel, the OLED display panel further comprises a voltage control chip electrically connected to the first anode voltage output electrode and the second anode voltage output electrode respectively so as to make the first anode voltage output electrode output the first sub reference voltage and the second anode voltage output electrode output the second sub reference voltage.

8. The OLED display panel according to claim 2, wherein the first anode voltage output electrode is located at a first end of the OLED display panel, the second anode voltage output electrode is located at a second end of the OLED display panel, the OLED display panel further comprises a voltage control chip, the first anode voltage output electrode is electrically connected to the voltage control chip so as to make the first anode voltage output electrode output the first sub reference voltage; and the second anode voltage output electrode is electrically connected to the first anode electrode voltage output electrode so as to make the second anode voltage output electrode output the second sub reference voltage.

9. The OLED display panel according to claim 3, wherein the first anode voltage output electrode is located at a first end of the OLED display panel, the second anode voltage output electrode is located at a second end of the OLED display panel; the OLED display panel further comprises a voltage control chip, the first anode voltage output electrode is electrically connected to the voltage control chip so as to make the first anode voltage output electrode output the first sub reference voltage; the second anode voltage output electrode is electrically connected to the first anode electrode voltage output electrode so as to make the second anode voltage output electrode output the second sub reference voltage.

10. The OLED display panel according to claim 4, wherein the first anode voltage output electrode is located at a first end of the OLED display panel, the second anode voltage output electrode is located at a second end of the OLED display panel; the OLED display panel further comprises a voltage control chip, the first anode electrode voltage output electrode is electrically connected to the voltage control chip so as to make the first anode voltage output electrode output the first sub reference voltage; the second anode voltage output electrode is electrically connected to the first anode electrode voltage output electrode so as to make the second anode voltage output electrode output the second sub reference voltage.

11. The OLED display panel according to claim 2, wherein the cathode voltage output electrode has a "⊓" shape, the cathode voltage output electrode outputs a cathode reference voltage to the light emitting diodes from other sides except the first end.

12. The OLED display panel according to claim 3, wherein the cathode voltage output electrode has a "⊓" shape, the cathode voltage output electrode outputs a cathode reference voltage to the light emitting diodes from other sides except the first end.

13. The OLED display panel according to claim 4, wherein the cathode voltage output electrode has a "⊓" shape, the cathode voltage output electrode outputs a cathode reference voltage to the light emitting diodes from other sides except the first end.

14. The OLED display panel according to claim 1, wherein the cathode voltage output electrode is located at a second end of the OLED display panel, the anode voltage output electrode is located at a first end of the OLED display panel, the cathode voltage output electrode outputs the cathode reference voltage to the light emitting diodes from the second end to the first end in order, and the anode voltage output electrode outputs the anode reference voltage to the light emitting diodes from the first end to the second end in order.

15. The OLED display panel according to claim 1, wherein the OLED display panel comprises a plurality of driving thin film transistors and a plurality of storage capacitors, a source of each of the driving thin film transistors receives the anode reference voltage, a drain of each of the driving thin film transistors is electrically connected to an anode of each of the light emitting diodes, a gate of each of the driving thin film transistors is electrically connected to each of the storage capacitors, and a cathode of each of the light emitting diodes receives the cathode reference voltage, wherein each of the driving thin film transistors is a P-type thin film transistor.

16. An OLED display device, comprising:
an OLED display panel;
wherein the OLED display panel comprises:
a plurality of light emitting diodes, arranged from a first end of a display area of the display panel to a second end opposite thereto;
an anode voltage output electrode, configured to output an anode reference voltage to a plurality of anodes of the light emitting diodes; and
a cathode voltage output electrode, configured to output a cathode reference voltage to a plurality of cathodes of the light emitting diodes;
wherein the anode reference voltage is sequentially provided to the light emitting diodes from the first end to the second end, and the cathode reference voltage is sequentially provided to the light emitting diodes from the second end to the first end;
or the anode reference voltage is provided to the light emitting diodes from the first end and the second end respectively,
wherein the cathode reference voltage is provided to the light emitting diodes through a plurality of cathode transmission lines, and at least two of the cathode transmission lines are extended in different directions such that the at least two of the cathode transmission lines crosses over each other.

17. The OLED display device according to claim 16, wherein the anode voltage output electrode comprises a first anode voltage output electrode and a second anode voltage output electrode, the anode reference voltage comprises a first sub reference voltage and a second sub reference voltage, the first anode voltage output electrode outputs the first sub reference voltage, the second anode voltage output electrode outputs the second sub reference voltage, the first sub reference voltage is sequentially provided to at least a part of the light emitting diodes from the first end to the second end, and the cathode reference voltage is sequentially provided to at least a part of the light emitting diodes from the second end to the first end.

18. The OLED display device according to claim 17, wherein the first sub reference voltage and the second sub reference voltage are both provided to all of the light emitting diodes.

19. The OLED display device according to claim 17, wherein a plurality of the light emitting diodes form a plurality of columns, and each of the columns of the light emitting diodes extends from the first end to the second end, and the first sub reference voltage and the second sub reference voltage are alternately and sequentially provided to each of the columns of the light emitting diodes.

20. The OLED display device according to claim 17, wherein the first anode voltage output electrode is located at a first end of the OLED display panel, the second anode voltage output electrode is located at a second end of the OLED display panel, the OLED display panel further comprises a voltage control chip electrically connected to the first anode voltage output electrode and the second anode voltage output electrode respectively so as to make the first anode voltage output electrode output the first sub reference voltage and the second anode voltage output electrode output the second sub reference voltage.

* * * * *